United States Patent [19]

DeLuca et al.

[11] Patent Number: 4,666,744
[45] Date of Patent: May 19, 1987

[54] PROCESS FOR AVOIDING BLISTER FORMATION IN ELECTROLESS METALLIZATION OF CERAMIC SUBSTRATES

[75] Inventors: Michael A. DeLuca, Holbrook; John F. McCormack, Roslyn Heights; Peter J. Oleske, Rocky Point, all of N.Y.

[73] Assignee: Kollmorgen Technologies Corporation, Dallas, Tex.

[21] Appl. No.: 679,709

[22] Filed: Dec. 10, 1984

Related U.S. Application Data

[63] Continuation-in-part of Ser. No. 607,874, May 10, 1984, Pat. No. 4,604,229, and a continuation-in-part of Ser. No. 611,193, May 21, 1984, Pat. No. 4,574,094, which is a continuation-in-part of Ser. No. 502,748, Jun. 9, 1983, abandoned.

[51] Int. Cl.[4] .............................................. B05D 3/04
[52] U.S. Cl. .................................... 427/304; 427/98; 427/305; 427/309; 427/404
[58] Field of Search ............... 427/304, 305, 309, 343, 427/404, 419.1, 443.1, 96, 97, 98

[56] References Cited

U.S. PATENT DOCUMENTS

| | | | |
|---|---|---|---|
| 3,296,012 | 1/1967 | Stalnecker | 427/309 |
| 3,628,999 | 12/1971 | Schneble et al. | 427/98 |
| 3,671,291 | 6/1972 | Miller et al. | 427/305 |
| 3,672,986 | 6/1972 | Schneble et al. | 427/98 |
| 3,690,921 | 9/1972 | Elmore | 427/299 |
| 3,772,056 | 11/1973 | Polichette et al. | 427/404 |
| 3,772,078 | 11/1973 | Polichette et al. | 427/404 |
| 3,925,578 | 12/1975 | Polichette et al. | 427/305 |
| 3,930,963 | 1/1976 | Polichette et al. | 427/97 |
| 3,959,547 | 5/1976 | Polichette et al. | 427/404 |
| 3,993,802 | 11/1976 | Polichette et al. | 427/96 |
| 3,994,727 | 11/1976 | Polichette et al. | 427/96 |
| 4,046,620 | 9/1977 | Andrascek et al. | 427/309 |
| 4,428,986 | 1/1984 | Schachameyer | 427/309 |

FOREIGN PATENT DOCUMENTS

51-47536  4/1976  Japan ..................................... 427/98

OTHER PUBLICATIONS

Baudrand, "Cleaning & Preparation of Ceramic and Metallized Ceramic Materials for Plating", Plating & Surface Finishing, pp. 72-75, Oct. 1984.

Jorgensen et al, "Copper Plating Process for Metallizing Alumina" International Society for Hybrid & Microelectronics, Sep. 1984.

Ameen et al, "Etching of High Alumina Ceramics to Promote Copper Adhesion", pp. 1518-1522, J. Electrochem Soc. Nov. 1973.

Primary Examiner—Sadie L. Childs
Attorney, Agent, or Firm—Morgan & Finnegan

[57] ABSTRACT

A process for avoiding blister formation between a metal layer which is electrolessly deposited on a surface of a ceramic substrate and the substrate. The substrate is adhesion promoted with an alkali metal composition containing between 0.35 and 0.9 mole fraction alkali metal compound, and water in an amount which is sufficient to lower the melting temperature of the composition to between 145° and 240° C. and adhesion promote the ceramic surface with the molten composition in a time period between 1 and 200 minutes. Thereafter, the adhesion promoted ceramic surface may be activated to render it receptive to electroless metal deposition. The treated ceramic surface is coated free of blisters using an electroless metal deposition bath with an adherent, metal layer having a thickness greater than 5 micrometers.

21 Claims, 5 Drawing Figures

PROCESS FOR AVOIDING BLISTER FORMATION IN ELECTROLESS METALLIZATION OF CERAMIC SUBSTRATES

RELATED APPLICATIONS

This application is a continuation-in-part of U.S. application Ser. Nos. 607,874, U.S. Pat. Nos. 4,604,229, and 611,193, U.S. Pat. No. 4,574,094, filed May 10 and 21, 1984, respectively, which in turn are a continuations in part of U.S. application Ser. No. 502,748, filed June 9, 1983, now abandoned.

BACKGROUND OF THE INVENTION

1. Field of the Invention

This invention relates to metallized ceramic articles and to a metallized conductor pattern directly and adherently bonded onto a surface of a ceramic substrate, and an improved process for producing the same. More particularly, this invention relates to a process for electrolessly depositing a thick, adherent layer of metal on a surface of a ceramic substrate free of blisters between the metal layer and the surface.

2. Description of the Prior Art

Metallized conductor patterns or uniform metal layers on ceramic substrates have been widely used in the electronic industry. For many years, ceramics have been metallized by high cost processes such as the ones using fused metal-glass pastes or by thin film vacuum deposition techniques. Attempts to reproducibly make circuit patterns by direct electroless deposition have not been successful due to poor adhesion of the metal films to the substrate and non-reproducible and non-uniform surface coverage.

Printed circuits on ceramics including alumina were described as early as 1947. See "Printed Circuit Techniques", National Bureau of Standards, Circular 468 (1947) and National Bureau of Standards, Misc. Pub. 192 (1948). One type, known as a thin film circuit, consists of a thin film of metal deposited on a ceramic substrate by one of the vacuum plating techniques. In these techniques, a chromium or molybdenum film, having a thickness of about 0.02 microns, acts as a bonding agent for copper or gold conductors. Photolithography is used to produce high resolution patterns etched from the thin metal film. Such conductive patterns may be electroplated, up to 7 microns thick. Due to their high cost, thin film circuits have been limited to specialized applications such as high frequency applications and military applications where a high pattern resolution is vital.

Another type of printed circuit, known as a thick film circuit, consists of circuit conductors composed of a metal and glass film fired on a ceramic substrate. Typically, the film has a thickness of about 15 microns. Thick film circuits have been widely used; they are produced by screen printing in a circuit pattern with a paste containing a conductive metal powder and a glass frit in an organic carrier. After printing, the ceramic parts are fired in a furnace to burn off the carrier, sinter the conductive metal particles and fuse the glass, thereby forming glass-metal particle conductors. The conductors are firmly bonded to the ceramic by the glass. Components may be attached to such conductors by soldering, wire bonding and the like.

Conductors in thick film circuits have only 30–60 percent of the conductivity of the respective pure metal. However, high conductivity of pure metal is needed to provide interconnections for high speed logic circuits. Because conductors in thick film circuits do not have such high conductivity, they do not provide optimum interconnections for high speed logic circuits.

The minimum conductor width and the minimum space between conductors which can be obtained by screen printing and firing under special high quality procedures is 125 and 200 microns, respectively. However, under normal production conditions, these minima are 200 and 250 microns, respectively.

In the thick film multilayer process, a first layer of metal powder and glass frit is printed on a ceramic substrate and fired, typically at 850° C., in a furnace. Then, an insulating dielectric layer is screened over the conductor pattern, leaving exposed only the points at which contact is made to the next layer of metallization. This dielectric pattern also is fired at 850° C. Then, a second dielectric layer is printed and fired. Two layers of dielectric must be printed and fired to ensure that there are no pinholes. After the two layers of dielectric have been printed and fired, the next conductor layer is printed and fired making contact to the lower conductor layer as necessary through the openings left in the dielectric layers.

Typical multilayer ceramic packages contain two to six layers of metallization. Eight layers are not uncommon. For two layers of metallization, the substrate will be printed four times and fired at 850° C. seven times, and for four layer, thick film, multilayer ceramic, ten times. By the processes of the present invention, the same connectivity as a three or four layer thick film multilayer ceramic can be achieved by a two-sided, plated through hole, conductor pattern.

Attempts have been made to directly bond pure metal conductors to ceramic substrates including alumina in order to achieve high conductivity for ceramic based circuit patterns. See U.S. Pat. Nos. 3,744,120, to Burgess et al. and 3,766,634 to Babcock et al. *Solid State Technology* 18/5, 42 (1975) and U.S. Pat. No. 3,994,430, to Cusano et al. describe a process for bonding copper sheets to alumina by heating the copper in air to form an oxide film on its surface. The treated copper sheet is bonded by the agency of this film to alumina at a temperature between 1065° C. and 1075° C. in a nitrogen furnace. In order to obtain well adhered copper foil without blisters: (1) the copper foil must be carefully oxidized to provide a black surface; (2) the copper oxide thickness must be carefully controlled; (3) the amount of oxygen in the copper foil must be controlled; (4) the oxygen content of the nitrogen furnace must be maintained at a controlled level to maintain a very moderately oxidizing atmosphere; and (5) the temperature must be controlled within one percent. This carefully controlled high temperature operation is difficult and expensive to tool for, to operate and to control. If the aforementioned extremely stringent controls are not maintained, blisters and other adhesion failures between the copper foil and the substrate are apparent. In spite of the difficult operating conditions, the process of Cusano et al. is being introduced into commercial application because of the need for the metallized product.

Although the above described systems are commercially used, the need for direct, simple metallization of ceramics with a layer or pattern of a pure metal conductor, such as copper, has prompted a continuous series of patents and proposed processes. See for example Apfelbach et al., Deutsches Patentschrift (DPS) No.

2,004,133; Jostan, DPS No. 2,453,192 and DPS No. 2,453,277; and Steiner DPS No. 2,533,524.

Other processes for producing printed circuit patterns on ceramic substrates are disclosed in U.S. Pat. Nos. 3,772,056; 3,772,078; 3,907,621; 3,925,578; 3,930,963; 3,959,547; 3,993,802 and 3,994,727. However, there is no teaching in all these patents of how to adhesion promote ceramic surfaces.

See also U.S. Pat. No. 3,296,012 to Stalnecker which discloses a process for producing a microporous surface for electrolessly plating alumina. Attempts to simply apply electroless metallization directly to ceramic substrates, have continually been tried and never been commercially successful. Toxic and corrosive materials such as hydrogen fluoride were tried to allow the direct bonding of electrolessly formed metal deposits to ceramics without the use of firing temperatures. See, e.g., Ameen et al, *J. Electrochem. Soc.*, 120, 1518 (1973). However, the hydrofluoric etch gave poor bond strength due to the resulting surface topography.

U.S. Pat. No. 4,428,986 to Schachameyer discloses a process for direct autocatalytic plating of a metal film on beryllia. The process comprises uniformly roughening the surface by immersing the beryllia in a 50% sodium hydroxide solution at 250° C. for 7 to 20 minutes, rinsing with water, etching the beryllia with fluoboric acid for 5 to 20 minutes to attack the glass alloying constituents, rinsing with water, immersing the beryllia in a solution of 5 g/l stannous chloride and 3N hydrochloric acid, rinsing with water, followed by treating with 0.1 g/l palladium chloride solution, rinsing with water, and then electrolessly plating nickel on the beryllia. However, the etching step removes the silica and magnesium from the grain boundaries of the beryllia, thereby weakening the beryllia surface. As a result, the process of Schachameyer was able to achieve only 250 psi (1.7 MPa) bond strength before the beryllia substrate broke. This bond strength is only about a third of the bond strength normal in thick film type circuits and for many purposes not adequate.

U.S. Pat. No. 3,690,921 to Elmore discloses the application of a concentrated sodium hydroxide solution to the surface of a ceramic substrate. The ceramic substrate is heated to drive off the solvent (water) and is heated further to melt the sodium hydroxide and etch the ceramic surface. The molten sodium hydroxide has a tendency to coalesce on, and not uniformly wet, the ceramic surface. Smooth ceramic surfaces, e.g., having a surface roughness below 0.13 micrometers (5 microinches) are difficult to completely wet with molten sodium hydroxide. As a result, uneven etching of ceramic surfaces, particularly smooth ceramic surfaces, results with the use of molten sodium hydroxide. In the best cases, when a metal is subsequently bonded to the ceramic surface, the bond strength is uneven across the ceramic surface. In the worst case, there is no adhesion of metal in some areas of the ceramic surface, or even no metal deposit because there was no adhesion of the electroless plating catalyst.

Elmore also describes an alternate embodiment wherein the ceramic substrate is directly immersed in a container of alkali metal hydroxide for 10–15 minutes at a temperature of 450° C. to 500° C. to etch the ceramic surface. Operation of the immersion procedure is difficult because: (1) the immersion of a ceramic article into a container of molten sodium hydroxide may crack the article due to thermal shock, thus resulting in low yields of useful product; and (2) a thick crust of carbonate forms on the surface of the molten sodium hydroxide impeding the manufacturing process. The processes described by Elmore did not achieve commercial production.

All of the aforementioned processes for depositing metals on ceramic surfaces which include an etching step using alkali metal compounds in a molten state do not guarantee uniform adhesion promotion of the ceramic substrate.

The trend in ceramic printed circuit manufacturing is toward smoother and more uniform surface topography. A smooth surface provides better conductor definition and improved parameters for propogation of very high frequency signals at the substrate-conductor interface.

Unfortunately, the smoother the ceramic surface, the lower the net surface energy. As a result, the alkali metal compound does not completely wet such smooth ceramic surfaces having surface roughnesses of, e.g. 0.6 micrometers. During the fusion step, the liquid caustic tends to coalesce into one or more areas on the surface of the substrate to achieve lower net surface energy. This results in a less than uniform surface etch and thus defective surface texture.

Total immersion of an alumina substrate in molten sodium hydroxides gives a uniform but severe surface etch. The severe surface etch results in a rough surface which does not permit fine conductor line resolution. In addition, such total immersion also tends to weaken the intrinsic structural integrity of the ceramic substrate resulting in cracks, especially in ceramic substrates provided with drilled holes.

As the purity of the ceramic increases, the surface also becomes smoother. Attempts to etch, for example, 99.5% pure electronic grade alumina by the procedures described in the Elmore U.S. Pat. No. 3,690,921, tend to result in a surface that is highly non-uniform.

Since 99.5% electronic grade alumina is normally used for microwave circuitry, surface roughness caused by deep etching must be avoided in order not to disturb the microwave signal propagation. 89 to 96% pure electronic grade alumina shows less of this problem, although it frequently is difficult to achieve satisfactory results on a manufacturing scale. However, it has not been possible to obtain a uniform, adherent metallization of smooth 99.5% alumina substrates by the procedures disclosed in Elmore U.S. Pat. No. 3,690,921.

Quaternary amine surfactants and detergent blends containing cationic wetting agents have been used for about 20 years to prepare plastic substrates for reception of palladium catalysts for electroless plating. Illustrative compositions containing these surfactants are disclosed in U.S. Pat. Nos. 3,627,558 to Roger et al., 3,684,572 to Taylor and 3,899,617 to Courduvelis. However, heretofore these surfactants have not been suggested for preparing ceramic substrates for reception of palladium catalysts for electroless plating. Moreover, commercially available, alkaline cleaner-conditioners which are used to prepare plastic substrates for reception of palladium catalysts for electroless plating have not been found to be effective in preparing ceramic substrates for reception of palladium catalysts for electroless plating.

SUMMARY OF THE INVENTION

1. Objects of the Invention

An object of the present invention is to provide a process for electrolessly plating a metal layer to a ceramic substrate to obtain excellent surface coverage and a bond strength of at least 3 MPa, preferably at least 5 MPa.

Another object of the invention is to produce an electrolessly plated metal layer on a ceramic substrate which may be used for fine line circuit applications with highly pure metal conductors.

A further object of this invention is to provide an improved process for adhesion promoting surfaces of ceramic substrates for adherent metallization.

An object of the invention is to provide an electrolessly deposited, direct bonded conductor having excellent adhesion to a ceramic substrate and a process for producing the metal coated ceramic substrate.

Still another object of the invention is to provide a reliable process for adherently metallizing the surfaces of a ceramic substrate while avoiding blister formation.

An object of the invention is to provide a two-sided plated ceramic substrate with a through hole conductor pattern and a conductor density comparable to a three or four layer, thick film, multilayer ceramic.

Additional objects and advantages of the invention will be set forth in part in the description, or may be realized by practice of the invention, the objects and advantages being realized and attained by means of the methods, processes, instrumentalities and combinations particularly pointed out in the appended claims.

2. Brief Description of the Invention

In U.S. application Ser. No. 607,874, filed May 10, 1984, there is described an improvement in a process for metallizing ceramic substrates which includes treating the surface to adherently receive metal and depositing metal on the treated surface. The improvement comprises treating the surface with a melt comprising one or more alkali metal compounds; and in a later step exposing the surface to an acidic halide solution containing one or more halides selected from the group consisting of chlorides, bromides and iodides in an amount greater than 0.5 moles halide per liter. The halide concentration is sufficient to promote adsorption of catalyst on the surface and eliminate bare spots in an adherent metal layer formed on the surface or selected parts thereof. The halide solution is used in a pre-treatment step immediately followed by, or constituting part of, the solutions employed in the catalyzing sequence for rendering said surface receptive to deposition of metal. The thus treated surface or selected parts of the surface are exposed to a metal depositing bath solution to form a uniform metal layer on said surface or selected parts thereof.

Also in U.S. application Ser. No. 611,193, filed May 21, 1984, there is described another improvement in a process for metallizing ceramic substrates which includes treating the surface to adherently receive metal and depositing metal on the treated surface. The improvement comprises treating the surface with a melt comprising one or more alkali metal compounds to adhesion promote or etch the surface; and in a later step exposing said surface to an adsorption promoter selected from the group consisting of quaternary compounds, ethyoxylated non-ionic compounds and nitrogen containing compounds. The nitrogen-containing compounds are selected from the group consisting of amine oxides, alkanolamines, amides, betaines, amino acids and guanidine derivatives, and are in an amount sufficient to, and at a pH which will promote adsorption of catalyst on the surface and eliminate bare spots in an adherent metal layer formed on the surface or selected parts thereof. The adsorption promoter is used in a pre-treatment step immediately followed by, or consituting part of, the solutions employed in the catalyzing sequence for rendering said surface receptive to the deposition of metal. The thus treated surface or selected parts of said surface are exposed to a metal depositing bath solution to form a uniform metal layer on said surface or selected parts thereof.

However, when the aforementioned procedures are used to deposit thick electrolessly deposited metal layers blisters may form between the metal layer and the ceramic substrate. Blisters form, for example, when copper layers are electrolessly deposited using electroless deposition solutions containing ethylenediaminetetraacetic acid (EDTA) as a complexing agent.

It has been discovered when thick metal layers are electrolessly deposited in the aforementioned procedures that blister formation may be avoided by admixing an adhesion promotion modifier, such as water, with an alkali metal compound to form an alkali metal composition, heating the alkali metal composition thus formed to render it molten and employing the molten alkali metal composition for adhesion promotion of the ceramic surface. Including the adhesion promotion modifier in the alkali metal composition containing the alkali metal compound results in an adhesion promoted, ceramic surface which is different in properties than a comparable ceramic surface etched with the alkali metal compound alone. The adhesion promoted ceramic surface obtained using the process of this invention has a microfaceted structure characterized by larger sized grains and a greater weight loss in comparison to a ceramic surface which has been adhesion promoted with the molten alkali metal compound alone under like conditions.

The present invention is directed to a process for electrolessly plating a metal layer on a ceramic substrate, such as alumina, which has excellent surface coverage and bond strength (i.e., at least 3 MPa, preferably at least 5 MPa) as measured by the "dot pull test" described herein below. The present invention also includes ceramic substrates having printed circuit patterns formed from such layers. Electrolessly deposited metal layers on the ceramic substrate are obtained having a thickness of at least 2.5 microns, preferably at least 5 microns, and conductor features typically with a width as low as 25 microns, perferably 50 microns.

The process of this invention comprises the steps of: (a) treating or adhesion promoting the surface of the ceramic with molten alkali metal composition at a temperature between 145° C. and 240° C.; (b) contacting the adhesion promoted surface with a solution capable of promoting adsorption of catalyst on the treated surface; (c) activating the treated surface for electroless plating; and (d) electrolessly depositing metal on the ceramic surface.

DETAILED DESCRIPTION OF THE INVENTION

Figure 1:
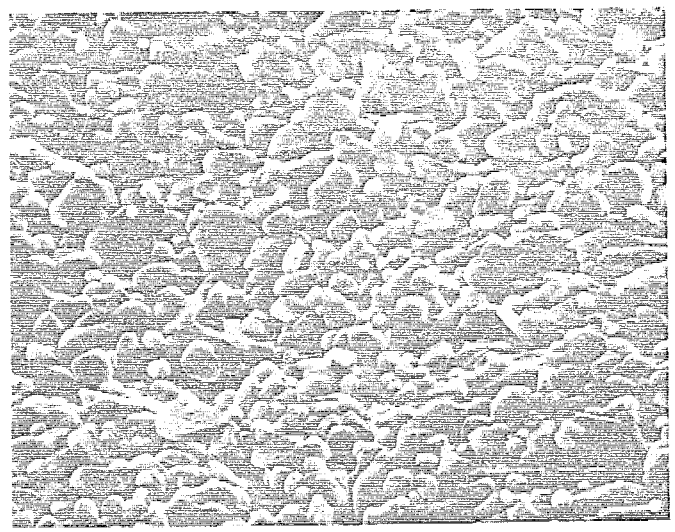
FIG. 1 is a scanning electron photomicrograph of a surface of a first ceramic substrate as described in Example 1 before adhesion promotion. The magnification is 1000×.

In one aspect, this invention concerns a process for metallizing a ceramic substrate which comprises adhesion promoting a surface of the substrate with a molten alkali metal compound; and subsequently electrolessly depositing a metal layer having a thickness greater than 5 micrometers on the adhesion promoted surface without the formation of blisters between the metal layer and the ceramic surface. The formation of blisters in the electrolessly deposited metal layer is avoided by admixing an adhesion promotion modifier with at least one alkali metal compound to provide an alkali metal composition. The adhesion promotion modifier when present in the composition is capable of modifying the alkali metal composition so that the molten composition adhesion promotes the ceramic surface to provide a microfaceted surface structure with larger grain size and greater weight loss in comparison to an adhesion promoted ceramic surface provided by the use of the molten alkali metal compound alone. Under like conditions the amount of adhesion promotion modifier is sufficient to lower the melting temperature of the alkali metal composition to between 145° C. and 240° C. and permit adhesion promote the ceramic surface for a time period between 1 and 200 minutes with the alkali metal composition in a molten state. The alkali metal composition is heated at a temperature between 145° C. and 240° C. to render it molten, and the ceramic surface is contacted with the molten alkali metal composition for a time period between 1 and 200 minutes and at a temperature between 145° C. and 240° C. to adhesion promote the ceramic surface.

After adhesion promoting the ceramic surface and before forming the metal layer thereon, the surface is exposed to an acidic halide solution containing one or more halides selected from the group consisting of chlorides, bromides and iodides in an amount greater than 0.5 moles halide per liter and sufficient to promote adsorption of catalyst on the surface and eliminate bare spots in an adherent metal layer formed on the surface or selected parts thereof, the solution being either used in a pre-treatment step immediately followed by, or constituting part of, the solutions employed in the catalyzing sequence for rendering the surface receptive to deposition of metal.

Alternately, after adhesion promoting the ceramic surface and before forming the metal layer thereon, the surface is exposed to a adsorption promoter selected from the group consisting of ethoxylated non-ionic compounds and nitrogen-containing compounds, the nitrogen-containing compounds being selected from the group consisting of quaternary compounds, amine oxides, alkanolamines, amides, betaines, amino acids and guanidine derivatives, in an amount sufficient to, and at a pH which will promote adsorption of catalyst on the surface and eliminate bare spots in an adherent metal layer formed on the surface or selected parts thereof, the adsorption promoter being either used in a pre-treatment step immediately followed by, or constituting part of, the solutions employed in the catalyzing sequence for rendering the surface receptive to deposition of metal.

In another aspect, this invention concerns an improvement in a process for metallizing a ceramic substrate which comprises adhesion promoting a surface of the substrate with a molten alkali metal compound; and subsequently electrolessly depositing a copper layer having a thickness greater than 5 micrometers on the adhesion promoted surface using an electroless copper deposition bath, the electroless copper bath comprising copper ions, ethylenediaminetetraacetic acid (EDTA) and a reducing agent for the copper ions. The improvement comprises:

avoiding the formation of blisters when electrolessly depositing a metal layer by first:

admixing water with at least one alkali metal compound to provide an alkali metal composition, the amount of water being sufficient to lower the melting temperature of the alkali metal composition to between 145° C. and 240° C. and adhesion promote of the ceramic surface in a time period between 1 and 200 minutes with the alkali metal composition in a molten state; and heating the alkali metal composition at a temperature between 145° C. and 240° C. to render it molten, and contacting the molten alkali metal composition with the ceramic surface for a time period between 1 and 200 minutes and at a temperature between 145° C. and 240° C. to adhesion promote the ceramic surface.

In another aspect, this invention concerns a process for producing a metal layer having a thickness greater than 5 micrometers on a surface of a ceramic substrate without blisters between the metal layer and the ceramic surface, which process comprises the steps:

providing an alkali metal composition containing water and between 0.35 and 0.9 mole fraction of an alkali metal compound;

heating the alkali metal composition at a temperature between 145° C. and 240° C. to render it molten;

contacting the ceramic surface with the molten alkali metal composition for a time period sufficient to adhesion promote the ceramic surface, the mole fraction of said alkali metal compound present in said alkali metal composition being selected to adjust the surface topography of the adhesion promoted surface so that grains of the metal which are to be subsequently deposited on the surface with an electroless metal deposition bath adhere to the surface without the formation of blisters between the metal layer and the ceramic surface;

activating the adhesion promoted surface to render it receptive for adherent metal deposition; and electrolessly depositing with the electroless metal deposition bath the metal layer having the desired thickness without the formation of blisters.

Any metal may be electrolessly deposited on the surface of a ceramic substrate in accordance with the present invention. Typically, copper, nickel, silver or cobalt metal layers are electrolessly deposited.

The ceramic surface first is treated at a temperature between 145° C. and 240° C. with an alkali metal composition which will provide an etched surface necessary to create a strong bond between the metal layer electrolessly deposited and the ceramic substrate. The preferred alkali metal composition for this purpose includes at least one alkali metal compound and is in the molten state. The preferred alkali metal compounds include sodium hydroxide, potassium hydroxide and sodium carbonate and potassium nitrate.

Suggested procedures for etching with molten alkali are described in U.S. application Ser. Nos. 607,874 and 611,193. Both of these disclosures described procedures in which alkali metal compounds with depressed melting points are used for adhesion promotion of ceramic surfaces.

The melting points of the alkali metal compound(s) may be depressed by dissolving up to 60% by weight, preferably up to 30% by weight, of low melting materials or even liquids in the alkali metal compound(s). Examples of such melting point depressants described in U.S. application Ser. Nos. 607,874 and 611,193 include stannous chloride, nitric acid, water, sodium and potassium formate, potassium acetate, Rochelle salts, borax, and the hydrates of lithium bromide, iodide, iodide and phosphate, and potassium pyrophosphate.

U.S. Ser. Nos. 607,874 and 611,193 described electrolessly depositing thin films of metal on ceramic substrates followed by electroplating to form metal layers having a thickness greater than 5 micrometers. There is described in these applications electrolessly deposited nickel layers and electrolessly deposited copper patterns 10 micrometers thick. The copper patterns were plated from electroless deposition baths comprising ethylenediamine tetra-2-propanol as the complexing agent. However this description does not tell one skilled in the art that blisters form when electroless metal deposition from solutions comprising EDTA as a complexing agent is employed to form metal layers having a thickness greater than 5 micrometers, and also does not tell how to prevent this blister formation.

It is advantageous to deposit the desired thickness of metal in one electroless plating operating. The most widely used electroless deposition solutions for depositing coherent thick layers of copper (from 5 micrometers to greater than 75 micrometers thick) comprise EDTA as the complexing agent. Blisters may form when copper layers are electrolessly deposited using the procedures described in U.S. Ser. Nos. 607,874 and 611,183 and using a deposition solution containing EDTA as the complexing agent.

Such blisters are formed in copper layers as thin as 0.8 micrometers electroless deposited from solutions at 70°–75° C. comprising:

| | |
|---|---|
| Copper | 0.04 moles/l |
| EDTA | 0.12 moles/l |
| Formaldehyde | 0.05 moles/l |
| pH (at 25° C.) | 11.5–11.8 |
| NaCN | 0.1 millimole/l |

Somewhat thicker copper layers may be deposited at lower temperatures without forming blisters. The EDTA containing electroless copper deposition baths used at 55° C. with 0.09 moles formaldehyde/liter and a pH of 12 (measured at 25° C.) produce blistered copper layers at thicknesses as low as 1.6 micrometers.

This invention concerns a procedure for preventing blister formation during electroless deposition of a metal layer on a ceramic substrate.

When substrates are adhesion promoted by the procedure of this invention, an adherent metal layer can be electrolessly deposited to any desired thickness without adhesion failures or blisters forming between the metal layer and the ceramic substrate.

The metal coated ceramic substrates produced according to the processes of this invention are useful for the production of etched printed wiring on the ceramic substrate. The techniques for making etched printing wiring on copper coated plastic substrates are well known in the printed circuit art. These techniques may be applied to economically produce printed wiring using the metal clad ceramic base materials made by the processes described herein.

In one preferred embodiment of this invention, the ceramic base materials are adhesion promoted or etched by immersion in solutions of alkali metal hydroxides and water at temperatures in excess of 145° C. Preferably, the temperatures are in excess of 160° C., and for alumina substrates, most preferably in excess of 170° C.

The temperature at which the ceramic base materials are adhesion promoted may be up to the boiling point of the alkali metal hydroxide/water solution, preferably under 240° C., more preferably under 180° C., and for alumina substrates, most preferably under 175° C.

The composition of the adhesion promotion solution can be varied from a mole fraction of 0.35 to 0.9 of the alkali metal compound, such as an alkali metal hydroxide. A mole fraction of 0.4 to 0.65 alkali metal compound is preferred and most preferred is a mole fraction of 0.47 to 0.53 alkali metal compound.

The immersion time for adhesion promotion will vary with the composition of the adhesion promotion system, the composition of the substrate, and the temperature of the adhersion promotion solution. Thus, for alumina substrates at 145° C., the adhesion promotion time will be from 2.5 to 8 hours and at 0.5 mole fraction about 4.5 to 5.5 hours. At 160° C., the optimum immersion in the adhesion promotion solution would be from 10 to 45 minutes and at 0.5 mole fraction, 25 minutes is preferred. At 170° C., the immersion time in the adhesion promotion solution is from 5 to 15 minutes for solutions with 0.5 mole fraction. At 180° C., the immersion time in an adhesion promotion solution is 3 to 8 minutes and the preferred time is 5 minutes in a 0.5 mole fraction solution. At 240° C., the mole fraction of alkali metal compound may be as high as 0.9 and the immersion time is 1 minute or less: in order to get adequate wetting of the ceramic surface by the adhesion promotion solution, the ceramic substrate is dipped into the solution, removed, and then immediately returned for a total immersion time of one minute or less.

While not wishing to be bound by theory, it is believe that that water acts as a modifier for enhanced ionization of the alkali metal compound and enhances the mobility of the alkali metal ion and its counter ion (e.g. hydroxide ion). The modification of the adhesion promotion compound results in a change in the surface grain structure observed after adhesion promotion.

FIG. 1 shows the surface grains of an alumina substrate before adhesion promotion. The surface was photographed by scanning electron microscopy at 1000×.

Figure 2:
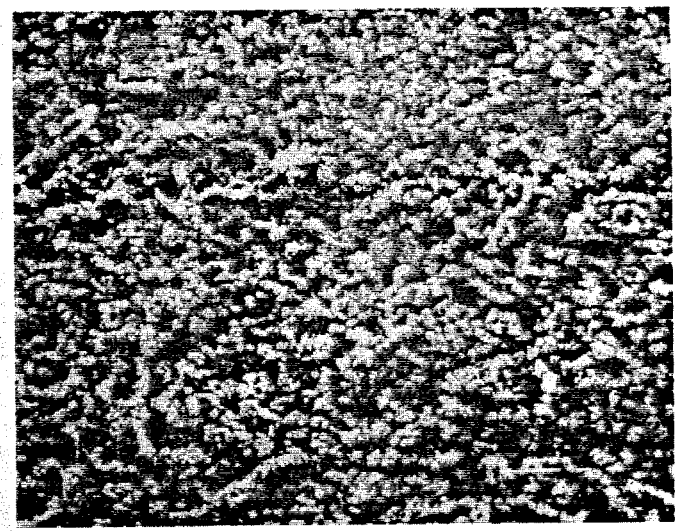
FIG. 2 is a scanning electron photomicrograph of a surface of a second ceramic substrate as described in Example 1 after adhesion promotion in sodium hydroxide at 450° C. The magnification is 1000×.

FIG. 2 shows the surface grain structure of an identical substrate (photographed by the same procedure) after adhesion promotion by the immersion in molten sodium hydroxide at 450° C. for 10 minutes as described by Elmore. The weight loss on 50 mm×50 mm×0.63 mm 96% alumina substrate was 0.15–0.25% by this proceedure. This surface is characterized by much smaller grains than the initial surface. When copper was electrolessly deposited on a surface treated by this procedure with the plating solution described in the 3 examples below, the copper blistered from the ceramic.

Figure 3:
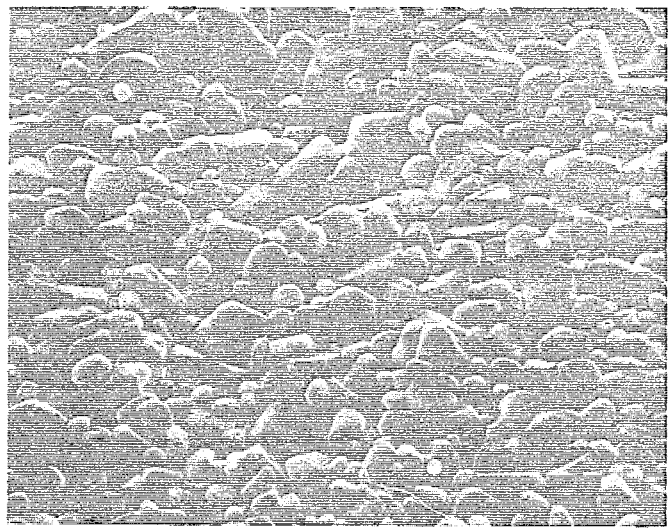
FIG. 3 is a scanning electron photomicrograph of the surface of a third ceramic substrate as described in Example 1, after the adhesion promotion of Example 1. The magnification is 1000×.

FIG. 3 shows the surface grain structure of another identical substrate (photographed at the same power)

after adhesion promotion as described in example 1 below. The adhesion promotion was in molten sodium hydroxide at 170° C. The sodium hydroxide had been modified by the admixture of water. This produced a large grain, microfaceted surface. The weight loss was 0.2–0.3% on the same type substrate by this procedure.

Figure 4:
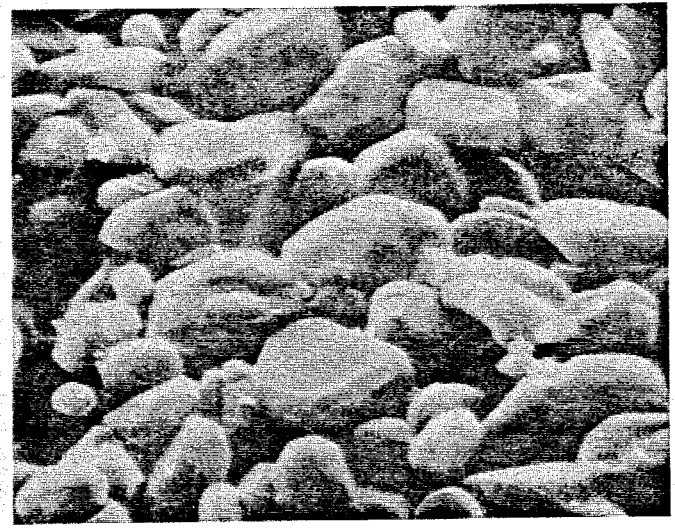
FIG. 4 is a scanning electron photomicrograph of the ceramic surface of FIG. 1 at 2600× magnification.
Figure 5:
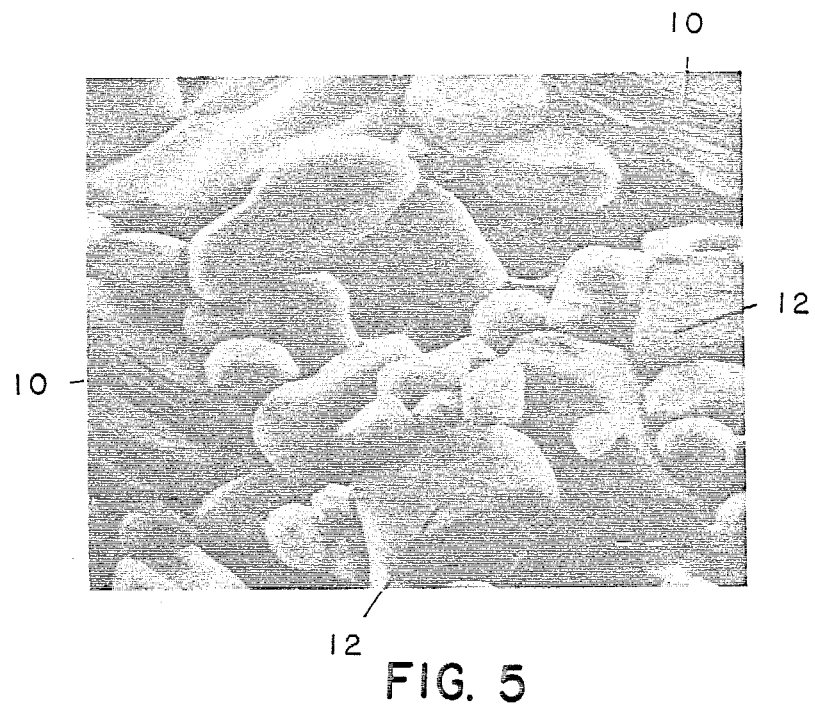
FIG. 5 is a scanning electron photomicrograph of the ceramic surface of FIG. 3 at 2600× magnification.

The microfaceted grain structure is illustrated in scanning electron micrographs at 2600× in FIGS. 4 and 5. FIG. 4 shows the same ceramic surface as FIG. 1 before adhesion promotion, and FIG. 5 shows the same surface as FIG. 3 and illustrates the microfaceted surface grains after adhesion promotion.

As can be seen in FIG. 5 these microfaceted grains have etched steps along, 10 the crystal planes of the grains, and etched sites, 12, on the surfaces of the grains. Copper electrolessly deposited on this surface of FIG. 5 is free of blisters, see Example 1 below.

Typical of the ceramic substrates etched by the molten compounds employed herein are aluminas, beryllias, titanates, forsterite, mullite, steatite, porcelains and mixtures of the foregoing.

Typical of the metal deposition solutions used are electroless plating solutions such as nickel, cobalt, gold, copper. See U.S. Pat. Nos. 3,485,643; 3,607,317; 3,804,638; 3,844,799 and the like. Electrolytic deposition solutions also may be used in the practice of this invention, e.g. for applying corrosion resistant surface countings.

In the processes described by Elmore, sodium hydroxide is rinsed from the ceramic surface with water, and then the ceramic surface is neutralized with dilute sulfuric acid and rinsed again before sensitizing the surface with stannous chloride, rinsing and seeding with palladium chloride to catalyze for electroless metal plating.

These processes are unreliable and frequently result in incomplete surface coverage with electrolessly formed metal deposits. This condition is completely unsatisfactory for production. With prolonged immersion in both the stannous chloride sensitizer solution and the palladium chloride seeder solution as well as incomplete rinsing steps, it sometimes may be possible to get complete surface coverage with metal. These steps, however, are not practical in production. Prolonged immersion in the sensitizer prevents economical throughput of work, and incomplete rinsing after the stannous chloride leads to loosely adhering precipitate particles forming in the seeder and in the electroless plating solutions and to the rapid decomposition of these solutions.

Alternatively, among the compounds that can be adsorbed and promote adsorption of the sensitizer are simple chlorides, bromides and iodides, and complexes of chlorides bromides and iodides. Acidic chloride, bromide and iodide solutions greater than 0.5 molar in the halide may be used to promote uniform adsorption on ceramic surfaces. These acidic halide solutions do not attack the glassy phase of the ceramic substrate.

The acidic chloride, bromide or iodide solution can be used as a pretreatment or predip solution for the ceramic substrate after adhesion promotion, rinsing, neutralizing and rinsing again; and before treating with, e.g., stannous chloride sensitizer. After such pretreatment, sensitizer is quickly adsorbed on the etched ceramic substrate. Immersion in the sensitizing solution need not be unduly prolonged. In addition, the tin species is so securely adsorbed that it is not inadvertently removed in a conventional rinsing step.

The acidic chloride, bromide or iodide predip or pretreatment solution preferably is greater than 2 molar in halide ion, and more preferably is greater than 3 molar in halide ion. The acidity of the halide solution preferably is greater than 0.001 molar in hydrogen ion, more preferably is greater than 0.01 molar in hydrogen ion, and most preferrably between 0.1 and 12 molar in hydrogen ion.

Alternatively, the chloride, bromide, or iodide concentration of the sensitizer solution may be increased to accomplish the same desired effect i.e., more strongly adsorbed sensitizer on the ceramic substrate. High acidity inhibits adsorption of tin sensitizers. The ratio of the halide to acid in a stannous ion sensitizer solution is preferably at least 15 to 1. It is possible to use halide to acid ratios as low as 2 to 1 but these are not preferred because higher tin concentrations, i.e., one molar tin are required.

Although we do not wish to be bound by theory, it is believed that in case of tin comprising solutions, the tin species which is adsorbed on the alumina is the tetrahalostannate (II) moiety. For example, high chloride ion concentration relative to acidity favors the formation of the tetrachlorostannate (II), while high acid concentration favor the formation of trichloro and dichloro stannate (II) complexes. See for example *Stability Constants of Metal Ion Complexes*, spec. Pub. 17, Sillen and Martell, The Chemical Society, London (1964), pp. 296-7.

When using a unitary catalyst solution comprising a chloride, bromide or iodide of palladium, tin and the halide acid or alkali metal halide salt without an acidic halide predip solution, the halide concentration may be varied over a range from 0.5 to 6 moles per liter, preferably greater than 1.5 moles per liter and preferably less than 4 moles per liter. The acidity may be varied from 0.03 to 6 moles per liter, preferably greater than 0.3 moles per liter and preferably less than 4 moles per liter.

For greater processing latitude and to minimize processing errors, the acidic halide pretreatments may be combined with a sensitizer solution formulated with the halide and acid concentrations described hereinabove.

Furthermore, the acidic halide predip also may be used with a unitary catalyst solution.

By using an acidic halide predip, other catalytic precious or semiprecious metals may be adsorbed onto the ceramic surface amongst which are the Group IA metals, silver and gold and the other Group VIII precious metals.

Numerous processes are employed in the manufacture of printed circuit boards. As will be understood by those skilled in the art, these printed circuit manufacturing processes may be used in conjunction with the adhesion promoting step of this invention and with the step of rendering the ceramic surface receptive to metallization in order to produce metallized ceramic printed circuit boards.

Other modes of operating this invention are, inter alia, disclosed in the examples.

EXAMPLE 1

A ceramic substrate 75 mm × 75 mm × 0.63 mm thick, consisting of 96% alumina (commercially available from Kyocera International, Inc., 8611 Balboa Ave., San Diego Calif. 92123). was adhesion promoted by immersing it for 10 minutes in a solution of 70% sodium hydroxide and 30% water at 172° C.

The substrate was allowed to cool for one minute and then rinsed in water, rinsed in 35% sulfuric acid, and rinsed again in water.

The substrate was activated by the following procedure.

1. Immerse for one minute in an aqueous conditioner solution containing an amphoteric surfactant (tallow betaine surfactant), a nonionic surfactant (nonylphenoxypolyethoxyethanol) and ethanolamine. Adjust solution to a pH 2 with sulfuric acid.
2. Rinse in water.
3. Immerse for 1 minute in an aqueous halide predip solution of 3.8 moles sodium chloride, 0.1 moles hydrochloric acid, and 0.025 moles stannous chloride per liter.
4. Immerse for eight minutes in palladium-tin activator solution at 40° C. The activator was according to the teachings of Kremer et al. U.S. Pat. No. 3,961,109. The activator was prepared by dissolving the concentrates of Kremer et al. in a 3.8 molar sodium chloride solution and comprised palladium, 0.15 g/l; tin(II) chloride, 23 g/l; sodium chloride, 226 g/l; hydrogen chloride, 4.6 g/l; and resorcinol, 1.2 g/l.
5. Rinse in water.

After activation, the substrate was plated at 75° C. in an additive electroless copper plating solution having the following composition:

| | |
|---|---|
| Copper sulfate | 0.03 moles/l |
| Ethylenediaminetetraacetate | 0.09 moles/l |
| Formaldehyde | 0.05 moles/l |
| Sodium hydroxide | to pH 11.7 (at 25° C.) |
| Sodium cyanide | 0.1 millimole/l |
| Sodium sulfate | 0.3 moles/l |
| Sodium formate | 0.6 moles/l |
| Surfactant (Alkylphenoxy-polyethoxyphosphate commercially available as Gafac RE610 TM from GAF Corp.) | 0.01 g/l |

After a copper layer 5 micrometers thick had been plated, the substrate was examined. The metal layer was uniformly attached to the substrate without blisters or other imperfections.

The procedure was repeated using a 96% alumina substrate (commercially available from Coors Porcelain Co.). Equivalent results were obtained.

EXAMPLE 2

Two alumina substrates were metallized by the procedure of Example 1 except that both were adhesion promoted for twenty minutes. One was adhesion promoted at 150° C. and the other was adhesion promoted at 164° C. Also, electroless deposition of copper was continued to a thickness of 28 micrometers.

The copper deposit on the substrates was uniform and free of blisters. The copper surfaces of the substrates were then imaged and the copper etched by convention photolithographic techniques to produce copper dots 1.9 mm in diameter. The adhesion of the copper to the ceramic substrate was measured by the "dot pull test". Wires were attached to the coper dots with solder and the force required to separate the dots from the substrate was measured. The results were as follows:

| Adhesion Promotion Temperature | Bond Strength |
|---|---|
| 150° C. | 6.9 MPa |
| 164° C. | 12.4 MPa |

EXAMPLE 3

Three 96% alumina substrates were adhesion promoted by immersion in molten sodium hydroxide/water mixtures for five minutes as follows:

| Substrate | Time | Temperature | % NaOH |
|---|---|---|---|
| A | 5 min. | 170° C. | 70 |
| B | 5 min. | 180° C. | 70 |
| C | 5 min | 195° C. | 76 |

The substrates were rinsed and neutralized as in Example 1.

Then, the substrates were activated as in Example 1, except that the activator solution used was a palladium-tin activator solution which contained 3.5 molar hydrochloric acid instead of 3.8 molar sodium chloride (commercially available as Catalyst 9F TM from Shipley Co., Newton, Mass.). After activation, the substrates were plated with a 28 micrometer thick layer of copper in the electroless copper solution of Example 1. The copper layers deposited on all three substrates had good adhesion to the substrates, and there was no blistering of the copper layers from the substrates.

EXAMPLE 4

Example 1 was repeated except that adhesion promotion was accomplished by immersion for twenty minutes in a solution of 60% sodium hydroxide and 40% water at 150° C. The copper deposit was plated to a thickness of 28 micrometers. The adhesion of the copper layer to the alumina substrate was good and there were no blisters between the copper layer and the substrate.

EXAMPLE 5

Example 1 was repeated except that for activation, the activating solution of Example 2 was used, and for metal deposition, instead of copper solution, a nickel-phosphorous electroless plating solution (Nickelmerse TM commercially available from Technic, Inc., Providence R.I. 02901) operating at 80° C. was used to plate a nickel layer 12 micrometers thick on the adhesion promoted and activated alumina substrate. The nickel deposit had good adhesion to the ceramic substrate and there were no blisters between the nickel layer and the substrate.

EXAMPLE 6

A ceramic substrate 75 mm×75 mm×063 mm thick composed of 99% alumina was adhesion promoted for 10 minutes at 180° C. in a solution of 72% sodium hydroxide and 28% water. It was neutralized, activated and plated by the procedures of Example 1, except that a copper layer 28 micrometers thick was deposited on the substrate. The copper layer uniformly adhered to the substrate with no blisters between the copper layer and the substrate.

EXAMPLE 7

The procedure of Example 6 was repeated except that the ceramic substrate was 90% alumina and the adhesion promotion was at 165° C. in a solution of 70% sodium hydroxide and 30% water. The results were equivalent.

EXAMPLE 8

A group of ceramic substrates were provided with copper surface layers by the procedure of Example 1. The adhesion of the copper layer to the surface was tested by the "dot pull test" procedure of Example 2. The average adhesion of the copper layer to the substrate was 13 MPa.

EXAMPLE 9

Example 1 was repeated on additional substrates except that the substrates were plated with electrolessly deposited copper layers ranging from 2.5 to 50 micrometers thick. All copper layers had good adhesion to the substrates without any evidence of copper blistering from the ceramic surface. The bond strength measured by the dot pull test averaged greater than 12.5 MPa and was independent of the metal thickness.

EXAMPLE 10

Example 1 was repeated except that the copper layer was deposited to a thickness of 75 micrometers. The copper layer had good adhesion without any evidence of copper blistering from the ceramic surface.

What is claimed:

1. In a process for metallizing a ceramic substrate which comprises adhesion promoting a surface of the substrate with a molten alkali metal compound; and subsequently electrolessly depositing a metal layer having thickness greater tha 5 micrometers on the adhesion promoted surface, the improvement which comprises:
   avoiding the formation of blisters between the electrolessly depsosited metal layer and the ceramic substrate by:
   admixing an adhesion promotion modifier comprising water with at least one alkali metal compound to provide an alkali metal composition, the adhesion promotion modifier when present in the composition is capable of modifying the alkali metal composition so that the molten composition adhesion promotes the ceramic surface to provide a microfaceted surface structure with larger grain size and greater weight loss in comparison to an adhesion promoted ceramic surface provided by the use of the molten alkali metal compound alone, the amount of adhesion promotion modifier being sufficient to lower the melting temperature of th alkali metal composition to between 145° C. and 240° F. and permit adhesion promotion of the ceramic surface for a time period between 1 and 200 minutes with the alkali metal composition in the molten state;
   heating the alkali metal composition at a temperature between 145° C. and 240° C. to render it molten; and contacting the molten alkali metal composition with the ceramic surface for a time period between 1 and 200 minutes and at a temperature between 145° C. and 240° C. to adhesion promote the ceramic surface; and
   subsequently electrolessly depositing a metal layer having a thickness greater than 5 micrometers on the adhesion promoted surface without the formation of blisters between the metal layer and the ceramic surface.

2. The process of claim 1, further including after adhesion promoting said ceramic surface and before forming said metal layer thereon, the step of exposing said surface to an acidic halide solution containing one or more halides selected from the group consisting of chlorides, bromides and iodides in an amount greater than 0.5 moles halide per liter and sufficient to promote adsorpotion of catalyst on the surface and eliminate bare spots in an adherent metal layer formed on the surface or selected parts thereof; and
   treating said surface with a catalyst solution for rendering said surface receptive to deposition of metal.

3. The process of claim 1, further including, after adhesion promoting said ceramic surface and before forming said metal layer thereon, the step of exposing said surface to a adsorption promoter selected from the group consisting of ethoxylated non-ionic compounds and nitrogen-containing compounds, said nitrogen-containing compounds being selected from the group consisting of quaternary compounds, amine oxides, alkanolamines, amides, betaines, amino acids and guinidine derivatives, in an amount sufficient to, and at a pH which will promote adsorption of catalyst on the surface and eliminate bare spots in an adherent metal layer formed on the surface or selected parts thereof; and
   treating said surface with a catalyst solution for rendering said surface receptive to deposition of metal.

4. In a process for metallizing a ceramic substrate which comprises adhesion promoting a surface of the substrate with a molten alkali metal compound; and subsequently electrolessly depositing a copper layer having a thickness greater than 5 micrometers on the adhesion promoted surface using an electroless copper deposition bath, the electroless copper bath comprising copper ions, ethylenediaminetetraacetic acid (EDTA) and a reducing agent for the copper ions, the improvement which comprises:
   avoiding the formation of blisters between a subsequently electrolessly deposited metal layer and the substrate by:
   admixing water with at least one alkali metal compound to provide an alkali metal composition, the amount of water being sufficient to lower the melting temperature of the alkali metal composition to between 145° C. and 240° C. and permit adhesion promotion of the ceramic surface for a time period between 1 and 200 minutes with the alkali metal composition in a molten state; and
   heating the alkali metal composition at a temperature between 145° C. and 240° C. to render it molten, and contacting the molten alkali metal composition with the ceramic surface for a time period between 1 and 200 minutes and at a temperature between 145° C. and 240° C. to adhesion promote the ceramic surface.

5. The process of claim 4 further including after adhesion pormoting said ceramic surface and before forming said metal layer thereon, the step of exposing said surface to an acidic halide solution containing one or more halides selected from the group consisting of chlorides, bromides and iodides in an amount greater than 0.5 moles halide per liter and sufficient to promote adsorption of catalyst on the surface and eliminate bare spots in an adherent metal layer formed on the surface or selected parts thereof; and treating said surface with a catalyst solution for rendering said surface receptive to deposition of metal.

6. The processs of claim 4 wherein said alkali metal compound is sodium hydroxide or potassium hydroxide.

7. The process of claim 4 wherein the alkali metal composition contains between 10 and 40% by weight water.

8. The process of claim 7 wherein said alkali metal composition is heated at a temperature between 160° C. and 180° C.

9. The process of claim 8 wherein said ceramic surface is adhesion promoted for a time period between 3 and 45 minutes.

10. The process of claim 8 wherein the alkali metal composition is heated at a temperature between 170° C. and 175° C.

11. The process of claim 10 wherein said ceramic surface is adhesion promoted for a time period between 5 and 15 minutes.

12. The process of claim 4 wherein the blister-free metal layer is electrolessly deposited on the ceramic surface to a thickness between a 5 micrometers and 75 micrometers.

13. A process for producing a blister-free metal layer having a thickness greater than 5 micrometers on a surface of a ceramic substrate without blisters between the metal layer and the substrate, which process comprises the steps:

providing an alkali metal composition containing water and between 0.35 and 0.9 mole fraction of an alkali metal compound;

heating the alkali metal composition at a temperature between 145° C. and 240° C. to render it molten;

contacting the ceramic surface with the molten alkali metal composition for a time period sufficient to adhesion promote the ceramic surface, the mole fraction of said alkali metal compound present in said alkali metal composition being selected to adjust the surface topography of the adhesion promoted surface so that grains of the metal which are to be subsequently deposited on the surface with an electroless metal deposition bath adhere to the surface without the formation of blisters between the metal layer and the ceramic surface;

activating the adhesion promoted surface to render it receptive for adherent metal deposition; and electrolessly depositing with the electroless metal deposition bath the blister-free metal layer having the desired thickness without the formation of blisters.

14. The process of claim 13 wherein the alkali metal compound is sodium hydroxide or potassium hydroxide.

15. The process of claim 13 wherein the alkali metal composition contains between 0.4 and 0.6 mole fraction of an alkali metal compound.

16. The process of claim 15 wherein the alkali metal composition is heated at a temperature between 170° C. and 175° C.

17. The process of claim 13 wherein the blister-free metal layer is electrolessly deposited on the ceramic surface to a thickness between 5 micrometers and 75 micrometers.

18. The process of claim 13 wherein the ceramic surface is contacted with the molten alkali metal composition by immersing the ceramic substrate in the molten alkali metal composition.

19. The process of claim 13 wherein the ceramic surface is adhesion promoted for a time period between 5 and 15 minutes.

20. The process of claim 2 wherein said acid halide solution constitutes part of said catalyst solution used for rendering said ceramic surface receptive to deposition of metal.

21. The process of claim 5 wherein said acid halide solution constitutes part of said catalyst solution used for rendering said ceramic surface receptive to deposition of metal.

* * * * *